(12) United States Patent
Zaal et al.

(10) Patent No.: US 7,804,582 B2
(45) Date of Patent: Sep. 28, 2010

(54) LITHOGRAPHIC APPARATUS, METHOD OF CALIBRATING A LITHOGRAPHIC APPARATUS AND DEVICE MANUFACTURING METHOD

(75) Inventors: Koen Jacobus Johannes Maria Zaal, Eindhoven (NL); Joost Jeroen Ottens, Veldhoven (NL); Judocus Marie Dominicus Stoeldraijer, Bladel (NL); Antonius Johannes De Kort, Veldhoven (NL); Franciscus Van De Mast, Eindhoven (NL); Marteijn De Jong, Wintelre (NL)

(73) Assignee: ASML Netherlands B.V., Veldhoven (NL)

( * ) Notice: Subject to any disclaimer, the term of this patent is extended or adjusted under 35 U.S.C. 154(b) by 614 days.

(21) Appl. No.: 11/494,794

(22) Filed: Jul. 28, 2006

(65) Prior Publication Data

US 2008/0024748 A1 Jan. 31, 2008

(51) Int. Cl.
*G03B 27/58* (2006.01)
(52) U.S. Cl. .............................. 355/72; 355/53; 355/30
(58) Field of Classification Search .................. 355/30, 355/53, 72
See application file for complete search history.

(56) References Cited

U.S. PATENT DOCUMENTS

| | | | |
|---|---|---|---|
| 4,509,852 A | 4/1985 | Tabarelli et al. | |
| 6,645,701 B1 * | 11/2003 | Ota et al. | 430/311 |
| 2005/0264778 A1* | 12/2005 | Lof et al. | 355/53 |
| 2006/0132740 A1 | 6/2006 | Ebihara | |

FOREIGN PATENT DOCUMENTS

| | | |
|---|---|---|
| EP | 1 304 597 A1 | 4/2003 |
| EP | 1 420 298 A2 | 5/2004 |
| EP | 1 420 300 A2 | 5/2004 |
| EP | 1 548 504 A1 | 6/2005 |
| EP | 1 628 161 A2 | 2/2006 |
| WO | 99/49504 A2 | 9/1999 |

OTHER PUBLICATIONS

Search and Examination Report for Singapore Application No. 200705299-6 mailed Feb. 20, 2009, 6 pgs.

* cited by examiner

*Primary Examiner*—Edward J Glick
*Assistant Examiner*—Mesfin T Asfaw
(74) *Attorney, Agent, or Firm*—Sterne, Kessler, Goldstein & Fox P.L.L.C (57) ABSTRACT

A lithographic apparatus includes a system to compensate for the effect of thermal distortion of the substrate table on position measurements of the substrate table using lateral mirrors in the substrate table. Methods of calibrating a lithographic apparatus using various substrate table scan trajectories and measurements of the localized position and rotation of lateral mirrors in the substrate table are presented. A dual stage lithographic apparatus with alignment marks defining the geometry of a lateral mirror used only at the exposure station to measure the geometry of the lateral mirror when the substrate table is at the measurement station.

6 Claims, 6 Drawing Sheets

Fig. 8 ature of at least a portion of the substrate table; a disturbance determining device or disturbance detector configured to estimate a thermally-induced shift in at least one of the position, orientation or shape of the at least one reflective element using the temperature determined by the substrate table temperature monitoring system; a substrate table position determining device or substrate table position detector arranged to determine a position of the substrate table by reflecting radiation from the at least one

US 7,804,582 B2

LITHOGRAPHIC APPARATUS, METHOD OF CALIBRATING A LITHOGRAPHIC APPARATUS AND DEVICE MANUFACTURING METHOD

FIELD

The present invention relates to a lithographic apparatus, a method for calibrating a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask/reticle or, where applicable, a programmable mirror array, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that is accelerated during a scanning exposure. This requires additional or more powerful motors and turbulence in the liquid may lead to undesirable and unpredictable effects.

Figure 2:
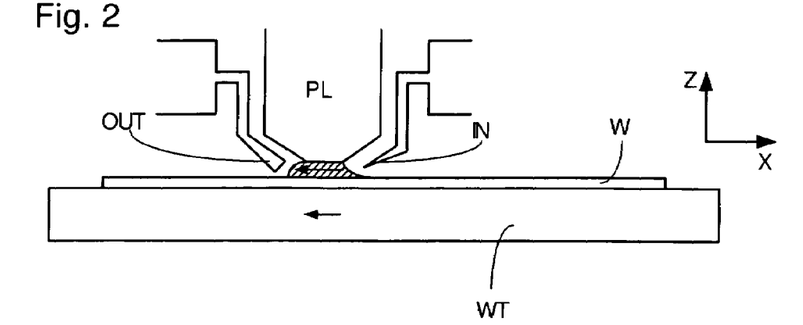
FIGS. 2 and 3 depict a conventional liquid supply system used in lithographic projection apparatus.
Figure 3:
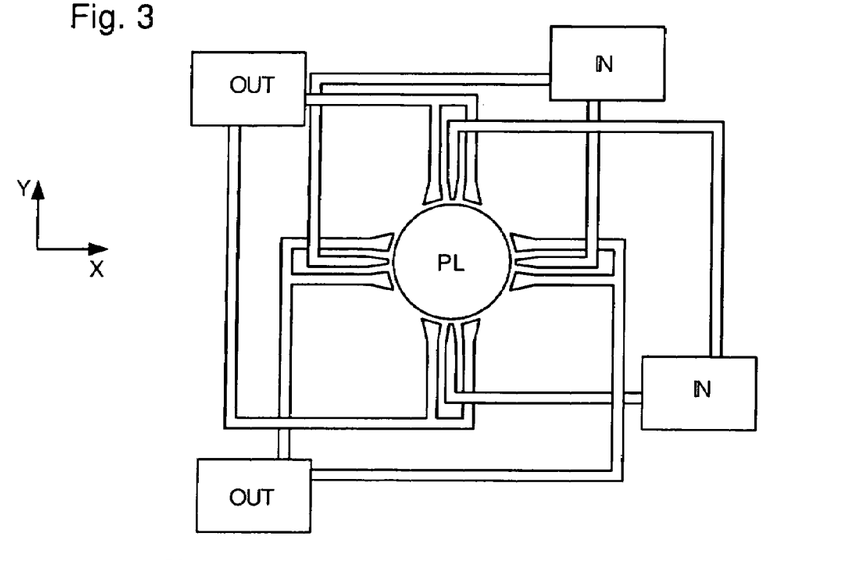

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
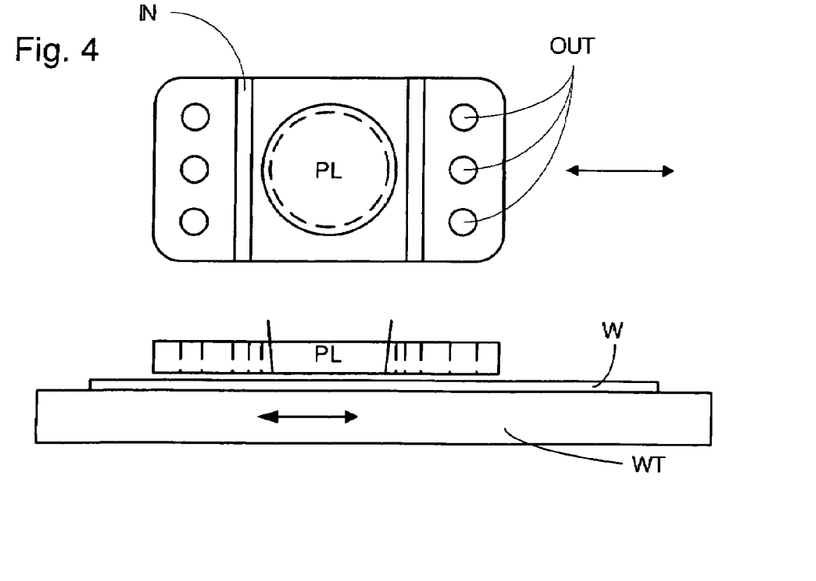
FIG. 4 depicts a conventional liquid supply system used in a lithographic projection apparatus.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in EP-A-1,420,298 hereby incorporated in its entirety by reference.

In EP-A-1,420,300 hereby incorporated in its entirety by reference the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. The provision of two stages allows levelling measurements and exposure to be carried out simultaneously. Alternatively, the apparatus has only one stage.

The position of the substrate during exposure can be determined optically by reflecting radiation from mirrors formed in lateral surfaces of the substrate table (also referred to as reflective members), using interferometry to determine a distance between a reference point in a detector for each mirror and a portion of the corresponding mirror surface. Disturbance of the mirror surfaces can lead to errors in the determination of the substrate position, which in turn can lead to overlay errors.

SUMMARY

It is desirable to compensate for disturbance of the mirror surfaces.

According to an embodiment of the invention, there is provided a lithographic apparatus including a projection system arranged to project a pattern from a patterning device onto a substrate, a substrate table constructed to support the substrate and having at least one reflective element or reflective member formed in a lateral side thereof; a substrate table displacement device capable of moving the substrate table relative to the projection system; a substrate table temperature monitoring system or substrate table temperature monitor configured to determine a temper reflective element and taking into account the shift in the properties of the at least one reflective element estimated by the disturbance determining device; and a control system arranged to supply a control signal to the substrate table displacement device in order to move the substrate table along a pre-determined path, the control signal being determined by reference to the position of the substrate table determined by the substrate table position determining device.

According to an alternative embodiment of the invention, there is provided a device manufacturing method including: providing a substrate table to support the substrate and having at least one reflective element formed in a lateral side thereof; providing a substrate table displacement device capable of moving the substrate table relative to a projection system; determining a temperature of at least a portion of the substrate table; estimating a thermally-induced shift in at least one of the position, orientation and shape of the at least one reflective element using the determined temperature; determining a position of the substrate table by reflecting radiation from the at least one reflective element and taking into account the estimated shift in the properties of the at least one reflective element; and using a control system to move the substrate table along a pre-determined path using the substrate table displacement device, a control signal for the control system being determined by reference to the position of the substrate table determined taking account of the estimated shift in the properties of the at least one reflective element.

According to an alternative embodiment of the invention, there is provided a method of calibrating a lithographic apparatus, including: providing a substrate table for supporting a substrate, the substrate table having first and second substantially planar reflective members formed in respective lateral sides thereof, the first reflective member being substantially orthogonal to a first axis X in the plane of the substrate table, and the second reflective member being substantially orthogonal to a second axis Y in the plane of the substrate table; moving the substrate table between a first position and a second position; during the movement, reflecting radiation from the first reflective element to measure a first local effective rotation of the surface of the first reflective element about a third axis Z perpendicular to the X and Y axes and at a plurality of different points on the first reflective element, and reflecting radiation from the second reflective element to measure a second local effective rotation of the surface of the second reflective element also about the Z axis and at a plurality of different points on the second reflective element; deriving an estimate of a shift in the angle between the first and second reflectors by calculating a difference between a calculated mean of the measured values of the first local effective rotation and a calculated mean of the measured values of the second local effective rotation or a mean difference between corresponding pairs of the measured values of the first and second local effective rotations.

According to an alternative embodiment of the invention, there is provided a device manufacturing method, including: providing a substrate table for supporting the substrate, the substrate table having first and second substantially planar reflective members formed in respective lateral sides thereof, the first reflective member being substantially orthogonal to a first axis X in the plane of the substrate table, and the second reflective member being substantially orthogonal to a second axis Y in the plane of the substrate table; moving the substrate table between a first position and a second position; during the movement, reflecting radiation from the first reflective element to measure a first local effective rotation of the surface of the first reflective element about a third axis Z substantially perpendicular to the X and Y axes and at a plurality of different points on the first reflective element, and reflecting radiation from the second reflective element to measure a second local effective rotation of the surface of the second reflective element also about the Z axis and at a plurality of different points on the second reflective element; deriving an estimate of a shift in the angle between the first and second reflectors by calculating a difference between a calculated mean of the measured values of the first local effective rotation and a calculated mean of the measured values of the second local effective rotation or a mean difference between corresponding pairs of the measured values of the first and second local effective rotations; and using the estimate of the shift in the control of movement of the substrate table relative to a projection system in a lithographic apparatus during later exposure of the substrate to a patterned radiation beam projected by the projection system from a patterning device, the lithographic apparatus being configured to use radiation reflected from the first and second reflective members to monitor and control a position of the substrate table during the exposure.

According to an alternative embodiment of the invention, there is provided a lithographic apparatus including: a substrate table to support a substrate; first and second substantially planar reflective members formed in respective lateral sides of the substrate table, the first reflective member being substantially orthogonal to a first axis X in the plane of the substrate table, and the second reflective member being substantially orthogonal to a second axis Y in the plane of the substrate table; a substrate table displacement device arranged to move the substrate table between a first position and a second position; a first interferometer arranged to reflect, during the movement, radiation from the first reflective element to thereby measure a first local effective rotation of the surface of the first reflective element about a third axis Z perpendicular to the X and Y axes and at a plurality of different points on the first reflective element; a second interferometer arranged to reflect, during the movement, radiation from the second reflective element to thereby measure a second local effective rotation of the surface of the second reflective element also about the Z axis and at a plurality of different points on the second reflective element; a mirror alignment determining device arranged to derive an estimate of a shift in the angle between the first and second reflectors by calculating a difference between a calculated mean of the measured values of the first local effective rotation and a calculated mean of the measured values of the second local effective rotation or a mean difference between corresponding pairs of the measured values of the first and second local effective rotations.

According to an alternative embodiment of the invention, there is provided a method of calibrating a lithographic apparatus, including: providing a substrate table and a substrate supported by the substrate table, the substrate table being provided with first and second reflective members formed in respective lateral sides thereof; moving the substrate table between a first position and a second position; during the movement, deriving a map of a spatial relationship between the substrate and the substrate table by measuring the positions of alignment marks on the substrate relative to known positions on the substrate table; and during the movement, reflecting radiation from the first and second reflective members and deriving therefrom at least one of their shape and orientation relative to each other.

According to an alternative embodiment of the invention, there is provided a device manufacturing method, including: providing a substrate table and a substrate supported by the substrate table, the substrate table being provided with first and second reflective members formed in respective lateral sides thereof; moving the substrate table between a first position and a second position; during the movement, deriving a map of a spatial relationship between the substrate and the substrate table by measuring the position of alignment marks on the substrate relative to known positions on the substrate table; during the movement, reflecting radiation from the first and second reflective members and deriving therefrom at least one of their shape and orientation relative to each other; and using the derived at least one of the shape and orientation relative to each other of the first and second reflective members in the control of movement of the substrate table relative to a projection system in a lithographic apparatus during later exposure of the substrate to a patterned radiation beam projected by the projection system from a patterning device, the lithographic apparatus being configured to use radiation reflected from the first and second reflectors to monitor and control a position of the substrate table during the exposure.

According to an alternative embodiment of the invention, there is provided a lithographic apparatus including: a substrate table arranged to support a substrate; first and second reflective members formed in respective lateral sides of the substrate table; a substrate table displacement device arranged to move the substrate table between a first position and a second position; a substrate to substrate table alignment device configured to derive, during the movement, a map of a spatial relationship between the substrate and the substrate table by measuring the position of alignment marks on the substrate relative to known positions on the substrate table; and a mirror disturbance determining device arranged, during the movement, to reflect radiation from the first and second reflective members and derive therefrom at least one of their shape and orientation relative to each other.

According to an alternative embodiment of the invention, there is provided a method of calibrating a lithographic apparatus, providing a substrate table to support a substrate with first and second substantially planar reflective members formed in lateral sides thereof, the first reflective member being substantially orthogonal to a first axis X in the plane of the substrate table and the second reflective member being substantially orthogonal to a second axis Y in the plane of the substrate table; arranging a first interferometer to reflect light from a localized surface portion of the first reflective member so as to measure a position of the localized surface portion along the X axis; arranging a second interferometer to reflect light from a localized surface portion of the second reflective member so as to measure a position of the localized surface portion along the Y axis; arranging the first interferometer to measure also a first localized rotation of the localized portions relative to a third axis Z; arranging the second interferometer to measure also a second localized rotation of the localized portions relative to the Z axis; moving the substrate table substantially along the X axis by reference to the output of the second interferometer and, during the movement, recording a set of measurements of the first and second local effective rotations at different points along the movement in order to derive information about the shape of the second reflective member, wherein during the movement along X the substrate table reaches speeds of at least 0.5 m/s.

According to an alternative embodiment of the invention, there is provided a device manufacturing method, providing a substrate table to support a substrate, the substrate table having first and second substantially planar reflective members formed in lateral sides thereof, the first reflective member being substantially orthogonal to a first axis X in the plane of the substrate table and the second reflective member being substantially orthogonal to a second axis Y in the plane of the substrate table; arranging a first interferometer to reflect light from a localized surface portion of the first reflective member so as to measure a position of the localized surface portion along the X axis; arranging a second interferometer to reflect light from a localized surface portion of the second reflective member so as to measure a position of the localized surface portion along the Y axis; arranging the first interferometer to measure also a first localized rotation of the localized portions relative to a third axis Z; arranging the second interferometer to measure also a second localized rotation of the localized portions relative to the Z axis; moving the substrate table substantially along the X axis by reference to the output of the second interferometer and, during the movement, recording a set of measurements of the first and second local effective rotations at different points along the movement in order to derive information about the shape of the second reflective member, wherein during the movement along X the substrate table reaches speeds of at least 0.5 m/s; and using the information about the shape of the first reflective member in the control of movement of the substrate table relative to a projection system in a lithographic apparatus during later exposure of the substrate to a patterned radiation beam projected by the projection system from a patterning device, the lithographic apparatus being configured to use radiation reflected from the first and second reflectors to monitor and control a position of the substrate table during the exposure.

According to an alternative embodiment of the invention, there is provided a lithography apparatus including: a substrate table arranged to support a substrate and having first and second substantially planar reflective members formed in lateral sides thereof, the first reflective member being substantially orthogonal to a first axis X in the plane of the substrate table and the second reflective member being substantially orthogonal to a second axis Y in the plane of the substrate table; a first interferometer configured to reflect light from a localized surface portion of the first reflective member so as to measure a position of the localized surface portion along the X axis; a second interferometer configured to reflect light from a localized surface portion of the second reflective member so as to measure a position of the localized surface portion along the Y axis, wherein: the first interferometer is configured to measure also a first localized rotation of the localized portions relative to a third axis Z; the second interferometer is configured to measure also a second localized rotation of the localized portions relative to the Z axis; and the lithographic apparatus is configured to move the substrate table substantially along the X axis by reference to the output of the second interferometer and, during the movement, record a set of measurements of the first and second local effective rotations at different points along the movement in order to derive information about the shape of the second reflective member, wherein during the movement along X the substrate table reaches speeds of at least 0.5 m/s.

According to an alternative embodiment of the invention, there is provided a lithographic apparatus including a projection system arranged to project a pattern from a patterning device onto a substrate, including: a substrate table arranged to support a substrate, the substrate table being movable from a measuring station at which a spatial relationship between the substrate and the substrate table can be determined and an exposure station at which the pattern from the patterning device can be projected onto the substrate; first and second reflective members formed in opposite sides of the substrate table and substantially parallel to each other; a first interferometer arranged to reflect light from the first reflective member in order to measure the position of the substrate table relative to a first axis while the substrate table is at the measuring station; and a second interferometer arranged to reflect light from the second reflective member in order to measure the position of the substrate table relative to the first axis while the substrate table is at the exposure station, wherein a plurality of alignment marks are formed in an upper surface of the substrate table in close proximity to the second reflective member and in a known spatial relationship therewith, the lithographic apparatus further including a measurement system arranged to measure the positions of the alignment marks at the measurement station using the first reflective member and thereby determine a spatial relationship between the first and second reflective members.

According to an alternative embodiment of the invention, there is provided a method of calibrating a lithographic apparatus including: providing a projection system to project a pattern from a patterning device onto a substrate; providing a substrate table to support a substrate, the substrate table being movable from a measuring station at which a spatial relationship between the substrate and the substrate table can be determined and an exposure station at which the pattern from the patterning device can be projected onto the substrate; providing first and second reflective members in opposite sides of the substrate table and substantially parallel to each other; providing a first interferometer to reflect light from the first reflective member to measure the position of the substrate table relative to a first axis while the substrate table is at the measuring station; providing a second interferometer to reflect light from the second reflective member to measure the position of the substrate table relative to the first axis while the substrate table is at the exposure station; and providing a plurality of alignment marks in an upper surface of the substrate table in close proximity to the second reflective member and in a known spatial relationship therewith; and measuring the positions of the alignment marks using the first reflective member while the substrate table is at the measurement station to thereby determine a spatial relationship between the first and second reflective members.

According to an alternative embodiment of the invention, there is provided a device manufacturing method, including: providing a projection system to project a pattern from a patterning device onto a substrate; providing a substrate table to support a substrate, the substrate table being movable from a measuring station at which a spatial relationship between the substrate and substrate table can be determined and an exposure station at which the pattern from the patterning device can be projected onto the substrate; providing first and second reflective members in opposite sides of the substrate table and substantially parallel to each other; providing a first interferometer to reflect light from the first reflective member to measure the position of the substrate table relative to a first axis while the substrate table is at the measuring station; providing a second interferometer to reflect light from the second reflective member to measure the position of the substrate table relative to the first axis while the substrate table is at the exposure station; and providing a plurality of alignment marks in an upper surface of the substrate table in close proximity to the second reflective member and in a known spatial relationship therewith; measuring the positions of the alignment marks using the first reflective member while the substrate table is at the measurement station to thereby determine a spatial relationship between the first and second reflective members; and using the spatial relationship between the first and second reflective members to control movement of the substrate table at the exposure station during later exposure of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
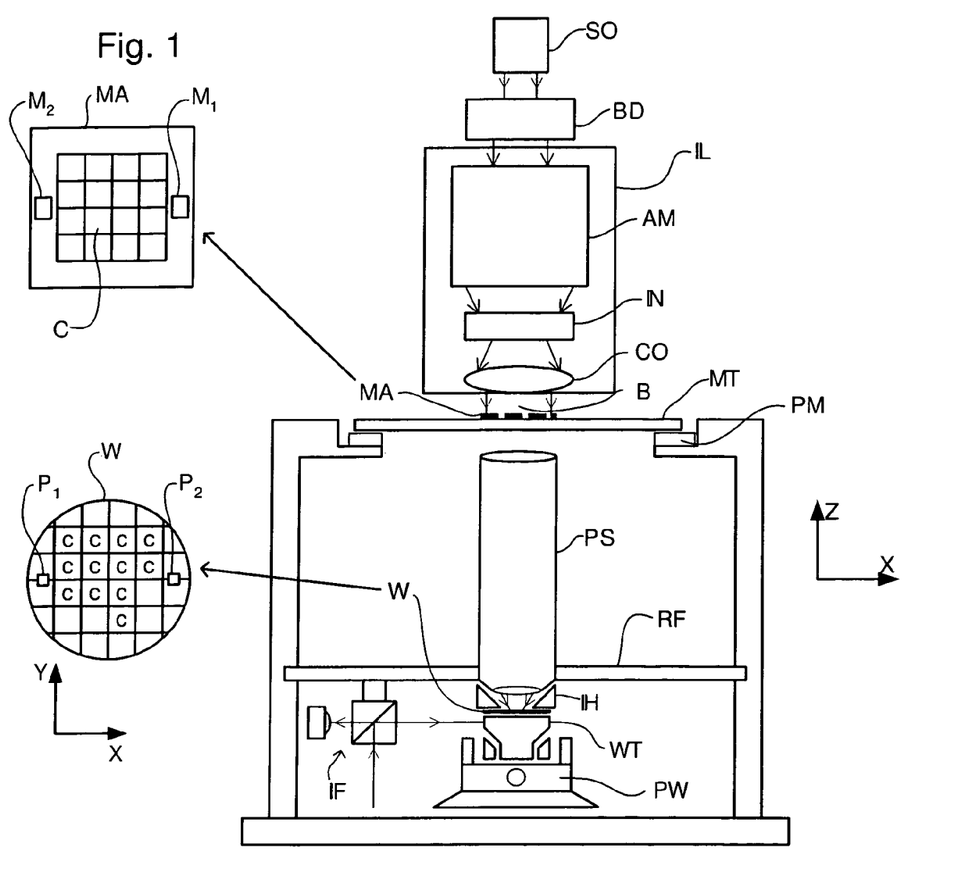
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

For substrate exposure sequences in which the substrate is moved relative to the projection system, an accurate system is desired to determine the position of the substrate W relative to the projection system PS during exposure, to ensure accurate repeatability of the movement during later exposure sequences and good overlay.

In order to determine the position of the substrate W relative to the projection system PS, the position of the substrate table WT relative to the projection system PS is determined. This may be achieved by forming mirrors in lateral surfaces of the substrate table WT, for example by attaching reflective components, element or members or by applying a reflective coating to the sides of the substrate table WT. In order to determine the position of the substrate table WT in the two dimensions of horizontal movement, it is desirable that at least two mirrors are provided at a non-zero angle relative to each other. An example configuration is to provide a nominally rectangular (or square) substrate table WT and form reflective elements or members in at least two sides of the substrate table WT, substantially perpendicular to each other. For example, defining X and Y as perpendicular axes in the plane of the substrate table WT (i.e. each substantially perpendicular to an axis of the projection system PS), a first mirror may be provided in a lateral side of the substrate table WT that is nominally perpendicular to the X axis and a second mirror may be provided in a lateral side of the substrate table WT that is nominally perpendicular to the Y axis (such mirrors are labeled 66 and 68 in FIG. 7—see below). Using interferometers arranged to reflect light from each of these mirrors and determine in each case a distance between the interferometer and the mirror surface, it is possible to determine the position of the substrate table WT along the X- and Y-axes respectively.

Figure 5:
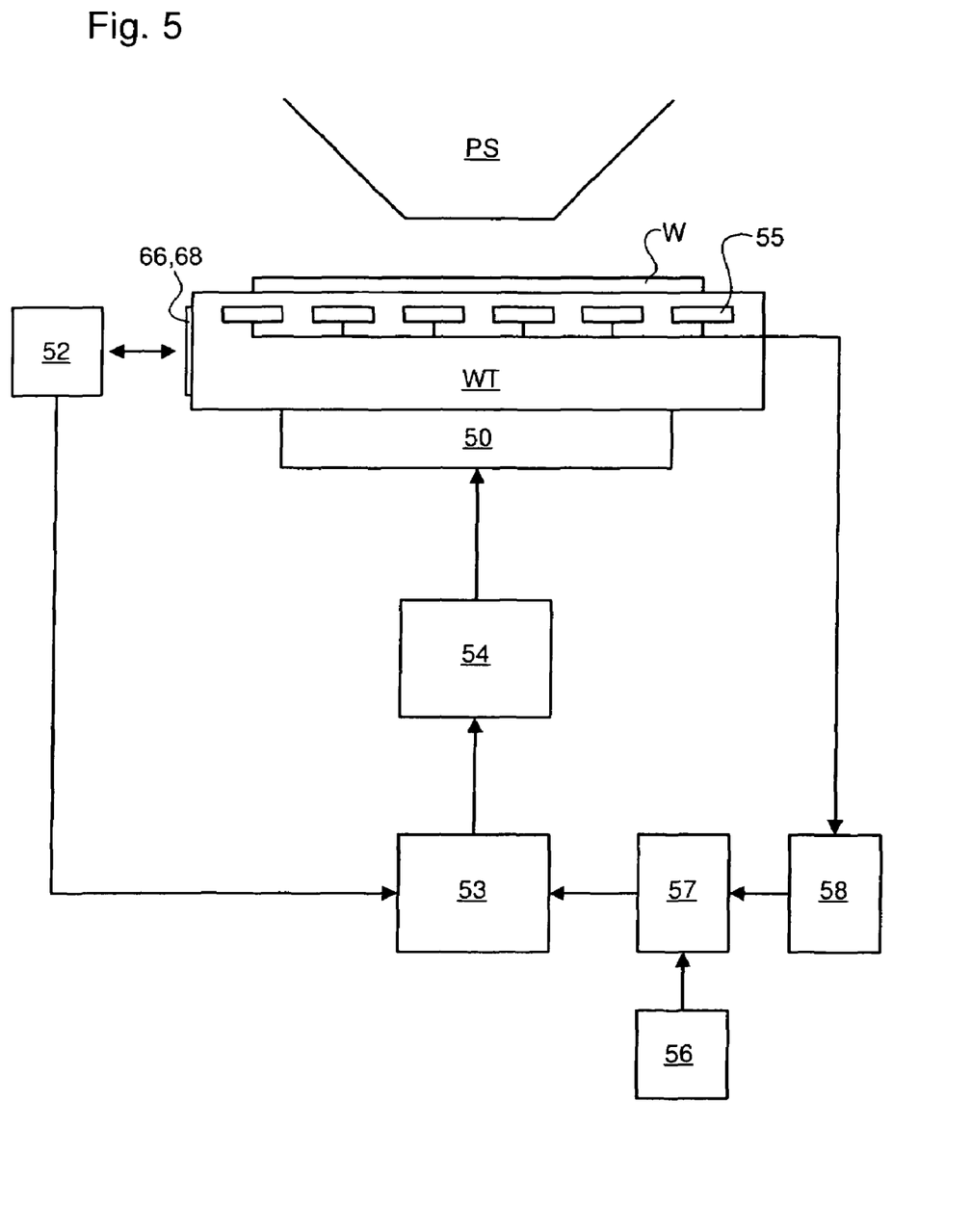
FIG. 5 depicts a lithographic apparatus with a substrate table temperature monitoring system, a disturbance determining device, and a control system according to an embodiment of the invention.

FIG. 5 shows a control system 54 configured to move a substrate W relative to the projection system PS during exposure in order to form a desired pattern on the substrate W. Feedback and/or feedforward control systems may be incorporated into the control system 54 in order to move the substrate table WT accurately through a desired sequence of positions using a substrate table displacement device 50. The position of the substrate table WT is provided to the control system 54, during the movement, by the substrate table position determining device 53 in combination with interferometers 52. As discussed above, the interferometers 52 may operate by reflecting light from mirrors 66,68 formed in lateral surfaces of the substrate table WT and measuring the local position of the corresponding mirror surface using interferometry.

Errors in the substrate table position provided by the substrate table position determining device 53 may cause corresponding errors in the operation of the control system 54 and the substrate table WT may be moved along a slightly different path during exposure than that intended. This may cause errors in the alignment of the pattern eventually formed on the substrate as well as a reduction in the quality of the overlay.

One way in which errors might occur is if the mirrors 66, 68 are disturbed from their nominal position and orientation relative to each other. Distortion of the substrate table WT caused by heating (from the exposure radiation, for example) and/or cooling (from evaporation of immersion liquid, where present, in the seal member, for example) may cause the mirrors to become distorted and mis-aligned with each other. Where the mirrors are nominally arranged to be perpendicular to each other, the angular misalignment may be termed "non-orthogonality".

According to the embodiment of the invention illustrated in FIG. 5, the substrate table position determining device 53 is adapted to compensate for this distortion based on a mirror disturbance determined by reference to measurements of the temperature of the substrate table WT.

The temperature of the substrate table WT is determined using a substrate table temperature monitoring device 58, which, in the embodiment shown, is connected to a plurality of temperature sensors 55 formed near the surface of the substrate table WT. Variations in this arrangement are possible. For example, a single temperature sensor may be used instead of a plurality of temperature sensors 55. Furthermore, instead of the sensors 55 being formed within the body of the substrate table WT, they may be affixed to an exterior surface.

The relationship between the measured temperature(s) and the mirror disturbance (for example, change in shape, position and/or alignment/orthogonality) of the mirrors 66,68 is determined by a disturbance determining device 57. The disturbance determining device 57 may calculate an expected distortion of the substrate table WT based on first principles, for example using a model of the thermal and mechanical properties of the substrate table WT and the appropriate physical laws. Alternatively, as shown in FIG. 5, a storage device 56 may be provided containing calibration data which provide a mapping from particular values of the measured temperature(s) to the expected distortion of the substrate table WT and mirrors 66,68 (or just of the mirrors directly). The calibration data to be stored in the storage device 56 may be obtained by carrying out exposure runs using trial wafers and patterns, and measuring the temperature(s) of the substrate table WT and corresponding distortion (independently) for a variety of different operating conditions. Interpolation may be used to derive data where measured temperature readings fall between those dealt with in the calibration tables stored in the storage device 56.

Calculating the expected distortion based on first principles or a theoretical model obviates the need for calibration experiments. On the other hand, the use of calibration data obviates the need for computing resources and in depth theoretical understanding of the properties of the substrate table WT and surrounding components.

The substrate table position determining device 53 receives an output from the disturbance determining device 57 and is arranged to calculate the position of the substrate table taking account of the disturbed position, shape and/or orientation of the mirrors. The substrate table position communicated to the control system 54 is therefore more accurate than would be the case if the mirror disturbance had not been compensated for. Imaging accuracy and overlay are therefore improved.

In general the thermal load of the substrate table WT is function of the substrate number (i.e. it depends on the recent exposure history of the apparatus, including how many substrates of a given lot have already been exposed), the scan routing of the substrate, the alignment scheme being used and the exposure settings of the projection system PS. In combination with the long time constants of the substrate table WT and the high thermal resistance of the substrate table WT, the deformation becomes a function of time.

Active compensation of thermal effects may not provide a complete solution. In addition to thermally-induced distortion of the substrate table WT during exposure, the relative orientation between different mirrors may still shift over time and/or from one substrate exposure to the next due to other factors. For example, the substrate table WT may not return exactly to its original shape after being heated and/or cooled by exposure radiation and/or immersion system components during a given run due to irreversible processes associated with thermal cycling of the substrate table WT. Errors may occur in the determination of the substrate table position even in the presence of a system configured to determine an expected disturbance of substrate table mirrors based on measurements of the substrate table temperature, because the theoretical model or calibration tables used to link the measured temperature(s) of the substrate table to the mirror distortion would not take into account changes to the system properties that occur from one substrate exposure to the next.

Figure 7:
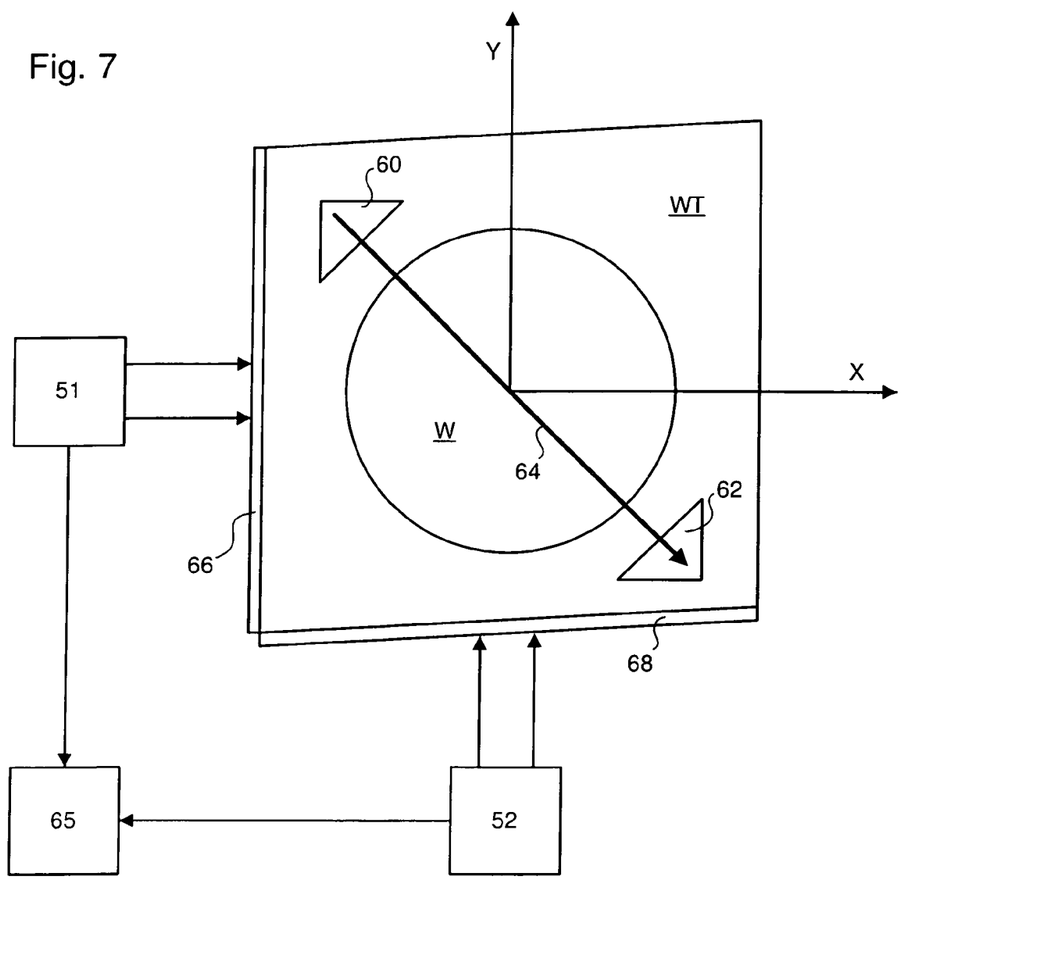
FIG. 7 depicts motion of the substrate table during an alignment calibration run.

One possible approach would be to carry out a detailed measurement of the pre-exposure disturbance of the mirrors before each exposure of the substrate. However, such an approach would be time-consuming and would lower the throughput of the lithography apparatus. FIG. 7 illustrates an alternative approach in which a scanning run used for a separate alignment step is exploited to simultaneously carry out an effective mirror disturbance measurement. Because no separate scanning procedures are needed for the disturbance measuring process, there is no significant reduction in throughput. Therefore, improved imaging accuracy and overlay may be obtained without any (or at least with a reduced) throughput cost.

As discussed above, the determination of the position of the substrate table WT relative to the projection system PS may be used as part of the process of determining the position of the substrate W relative to the projection system PS. However, it is also desirable to determine the spatial relationship between the substrate W and the substrate table WT. It is with alignment procedures associated with determining this latter property that the background (or pre-exposure) mirror disturbance determining procedure according to an embodiment of the invention is combined.

The alignment of the substrate W relative to the substrate table WT may be carried out while the substrate table WT is in substantially the same position as it will be for exposure of the substrate with the desired dose pattern. An alternative arrangement is illustrated schematically in FIG. 6 (which may be applied to any of the embodiment described above) where a separate measurement station 46 (also referred to as a substrate to substrate table alignment device when configured to perform this function) is provided to perform the substrate alignment and/or levelling. When the alignment is complete, the substrate table WT is moved to an exposure station 44, where exposure of the desired dose pattern onto the substrate W can be carried out. Normally, only the exposure station 44 would be provided with a system to maintain an immersion liquid between the final element of the projection system PS and the substrate W (for example the seal member 40 for containing the immersion liquid). Generally, in such a setup, the substrate table WT is provided with a reference 48, sometimes referred to as a fiducial, which can include a plate etched through with a pattern corresponding to a standard alignment mark underneath which is a radiation sensor, also known as a transmission image sensor (TIS), responsive to radiation. At the measurement station 46, the substrate table WT is moved to detect the reference 48 using an alignment system within a measurement system 42 and then to detect the alignment marks on the substrate W thereby enabling the location, in directions X, Y and Rz (rotation about the Z-axis) of the alignment marks to be found (in other words a map of the substrate alignment marks is obtained at the measurement station 46, corresponding in effect to a map of a spatial relationship between the substrate W and substrate table WT). In an embodiment, the location of the alignment marks are measured and determined relative to the reference 48.

Figure 6:
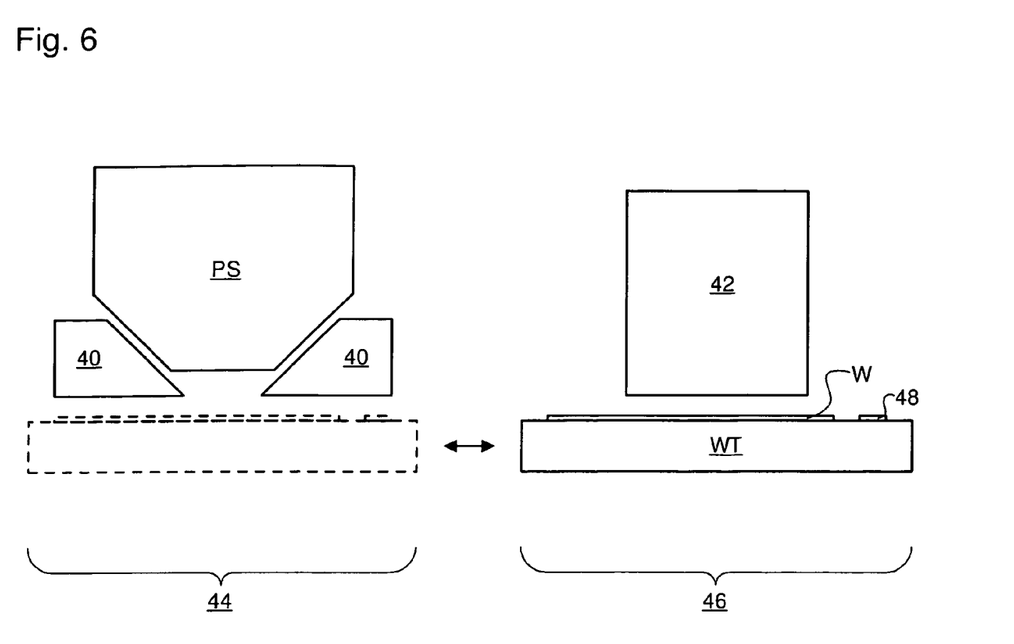
FIG. 6 illustrates measurement and exposure stations in a dual stage immersion system.

Level measurement of the substrate W can also be carried out at the measurement station 46. In order to measure the level of the substrate W, a leveling beam (projected from the measurement system 42) can be used that traverses a first grating prior to reflection by the substrate W. A second grating is then placed in the path of the leveling beam after reflection by the substrate W. The extent to which the images of the first and second gratings coincide is measured by a level measurement sensor and is determined by the height and/or tilts of the substrate W (the Z coordinate, rotation about the X-axis, Rx, and the rotation about the Y-axis, Ry, are thus determined). For a further description of level measurement of substrates reference is made to European patent application EP 02,257,251 herein incorporated in its entirety by reference. Hence, using data from the alignment of the substrate W and the level measurement of the substrate W a map of the substrate W can be generated at the measurement station 46.

An example arrangement is shown in FIG. 7, where alignment of the substrate W relative to the substrate table WT is carried out using two transmission image sensors (TISs) 60 and 62 (corresponding to particular embodiments of the reference 48 mentioned above). The TISs 60 and 62 are fixed relative to the substrate table WT and are positioned outside of the region of the substrate W on an upper surface of the substrate table WT. Alignment marks on the substrate W and on the TISs are then exposed by the alignment system within the measurement system 42 and the spatial relationship between the substrate W and the substrate table WT can be determined. In a dual stage system, the alignment measurements would be carried out at a measurement station 46 as described above.

In the configuration shown in FIG. 7, the substrate table WT is moved so as to expose regions along the line of arrow 64, starting by exposing a first TIS 60, followed by a series of regions on the substrate W, and finishing at a second TIS 62. The path 64 may be chosen so as to move the substrate table WT through the full range of positions, in both X and Y directions, that will be encountered during exposure of the pattern to be formed on the substrate W in the pattern exposure stage. Preferably, the substrate table WT is moved along a substantially 45 degree path relative to the planes of the mirrors.

According to an embodiment of the invention, a mirror alignment-determining device 65 is provided which determines a misalignment between different mirrors 66 and 68 in the substrate table WT by reference to measurements from interferometers 51 and 52 configured respectively to reflect radiation from localized regions on the respective mirrors. The interferometers are configured simultaneously each to emit a plurality of laser beams (for example two), spatially separated along a direction substantially parallel to the surface of the corresponding mirror in the plane of the substrate table WT (i.e. perpendicular to the axis (the "Z-axis") of the projection system PS) but with a separation that is small relative to the width of the mirrors so as to make a localized measurement of the mirror surface. The provision of a plurality of simultaneous radiation beams makes it possible for the interferometers to measure not only the relative position of the localized portion of the mirror being measured but also the local rotation of the mirror surface about the Z-axis. If there is no rotation (i.e. the portion of the mirror surface is perpendicular to the radiation beams), no difference in length of the radiation beams will be detected. If finite Z rotation exists, there will be a difference in length of the radiation beams and the extent of the difference in length will reveal the extent of the rotation. For the configuration shown in FIG. 7, local effective rotation of the X mirror surface about the Z axis, detected by interferometer 51, is denoted Rzx. Local effective rotation of the Y mirror surface about the Z-axis, detected by interferometer 52, is denoted Rzy.

When the substrate table WT is moved relative to the projection system PS along path 64, the interferometers can measure the position of the mirror surfaces and their local Rzx and Rzy values at a number of different positions on their respective surfaces. The separation of measured portions on the mirror surfaces will depend on the frequency at which measurements are made: the "sampling frequency". The shape of the mirror surfaces can be derived by reference to the local mirror positions measured at each of the sampled points (i.e. the separation of the portion of the mirror from which the inteferometer reflects light from the interferometer, or the length of the interferometer radiation beam). The average rotation of a mirror may be derived by taking a weighted mean of the Rzx or Rzy values of the sampling points for that mirror. The weighting is desirable because the density of measured regions on a given mirror may vary during the alignment scan. In the arrangement shown in FIG. 7, assuming constant scanning speed and sampling frequency, each of the samples could be given the same weighting because the substrate table WT moves in a straight line from the start of the alignment scan to the end of the alignment scan. However, if the alignment scan was not straight, or the scanning speed and/or samples frequency were variable, the density of points would vary and it would be desirable to apply different weightings to different samples. For example, in regions of the mirror where samples were taken more frequently, it might be necessary to reduce the sample weighting so that the local surface rotation in that region does not contribute excessively to the calculation of the average rotation, and vice versa.

If the average rotation of the X mirror 66 is denoted xrot and the average rotation of the Y mirror 68 is denoted yrot, the overall misalignment of the X and Y mirrors (or non-orthogonality) is the difference in the mean values of Rzx and Rzy:

misalignment=yrot−xrot=mean(Rzy)−mean(Rzx)= mean(Rzy−Rzx).

Combining the measurements of Rzx and Rzx along the diagonal scan with scans along X and Y can be used to derive more detailed information about the shape and orientation of the mirrors.

As described above, when the mirrors of a mirror block have a shape Y(X) and X(Y) to a perfectly rectangular mirror block, the Rzx and Rzy measurement will measure the local angle of the mirror as function of the position along the mirror, as follows:

Rzy=d{Y(X)}/dX

Rzx=−d{X(Y)}/dY

Reversing the equations yields:

$$Y(X) = \int_0^X Rzy(x)dx + Y(0)$$

$$X(Y) = -\int_0^Y Rzx(y)dy + X(0)$$

Scanning in the X-direction at Y=Yfixed and measuring both Rzx and Rzy gives:

$$ScanY(X) = \int_0^X (Rzy(x) - Rzx(Yfixed))dx$$
$$= \int_0^X (Rzy(x))dx - Rzx(Yfixed)X$$
$$= Y(X) - Y(0) - aX$$

Rearranging gives:

Y(X)=ScanY(X)+Y(0)+aX

This is the shape of the mirror Y(X) relative to an unknown rotation ax and translation Y(0), so Y(X) is known relative to a line. Scanning in Y-direction at X=Xfixed and measuring both Rzx and Rzy gives:

$$ScanX(Y) = \int_0^Y (Rzy(Xfixed) - Rzx(y))dy$$
$$= -\int_0^Y (Rzx(y))dy + Rzy(Xfixed)Y$$
$$= X(Y) - X(0) - bY$$

Rearranging gives:

X(Y)=ScanX(Y)+X(0)+bY

This is the shape of the mirror X(Y) relative to an unknown rotation bY and translation X(0), so X(Y) is known relative to a line.

Scanning in X and Y in a 45 degree angle measuring both Rzx and Rzy gives, at a general point on the scan line defined by X=S and Y=S:

$$ScanXY(S) = \int_0^S (Rzy(s) - Rzx(s))ds$$
$$= \int_0^S Rzy(s)ds - \int_0^S Rzx(s)ds$$

and since Rzy only depends on X and Rzx only on Y, the following is true:

$$ScanXY(S) = \int_0^X Rzy(x)dx - \int_0^Y Rzx(y)dy \quad \text{for } X = S, Y = S$$
$$= \{Y(X) - Y(0)\} + \{X(Y) - X(0)\} \quad \text{for } X = S, Y = S$$
$$= \{ScanY(X) + aX\} + \{ScanX(Y) + bY\} \quad \text{for } X = S, Y = S$$
$$= \{ScanY(X) + ScanX(Y)\} + \{aX + bY\} \quad \text{for } X = S, Y = S$$
$$= \{ScanY(S) + ScanX(S)\} + \{aS + bS\}$$

Rearranging gives:

{aS+bS}=ScanXY(S)−{ScanY(S)+ScanX(S)}

Now we have the following equations involving the results from three scans:

X(Y)=ScanX(Y)+X(0)+bY

Y(X)=ScanY(X)+Y(0)+aX

{aS+bS}=ScanXY(S)−{ScanY(S)+ScanX(S)}

Splitting the mirror rotations bY and aX into a rigid mirror block rotation "r" and shear "f" gives:

$$X(Y) = ScanX(Y) + X(0) - rY + fY$$
$$Y(X) = ScanY(X) + Y(0) + rX + fX$$
$$ScanXY(S) - \{ScanY(S) + ScanX(S)\} = \{(r+f)S + (-r+f)S\}$$
$$= 2fS$$

From the last equation, the shear "f" can be determined:

$$fS = 0.5 * \{\text{Scan}XY(S) - \{\text{Scan}Y(S) + \text{Scan}X(S)\}\}$$

Taking the derivative gives:

$$f = d[0.5 * \text{Scan}XY(S) - \{\text{Scan}Y(S) + \text{Scan}X(S)\}]/dS$$
$$= 0.5 * \{d[\text{Scan}XY(S)]/ds - d[\text{Scan}Y(S)]/ds - d[\text{Scan}X(S)]/ds\}$$

which is basically subtracting linear fits from the scans ScanX and ScanY from the linear fit of ScanXY. Substituting:

$$X(Y) = \text{Scan}X(Y) + X(0) - rY +$$
$$0.5 * \{d[\text{Scan}XY(S)]/ds - d[\text{Scan}Y(S)]/ds - d[\text{Scan}X(S)]/ds\} * Y$$
$$Y(X) = \text{Scan}Y(X) + Y(0) - rX +$$
$$0.5 * \{d[\text{Scan}XY(S)]/ds - d[\text{Scan}Y(S)]/ds - d[\text{Scan}X(S)]/ds\} * X$$

which leaves only the unknown positions X(0) and Y(0), and the unknown rotation "r". These parameters are routinely determined when the substrate is aligned relative to the substrate table.

Therefore, the three scans ScanX, ScanY and ScanXY can give the mirror shapes X(Y) and Y(X).

The accuracy of the interferometric measurements (i.e. ScanX, ScanY and ScanXY) during the above scans dictates the precision with which the mirror shapes can be obtained. Taking many readings during a slow scan over the mirrors can reduce errors from the interferometry. However, this approach takes a long time and may reduce throughput where it is desirable to measure the mirror shapes on a regular basis (for example, between every exposure).

In lithography applications, it is often the case that the interferometry measurements are subject to errors with high frequency components: so-called "rapid errors". For example, rapid errors may be defined as those that occur on time scales that are significantly shorter than the time necessary to carry out a measurement scan across the mirror over a distance equal to the minimum expected wavelength of the mirror distortions of interest (or resolution of the mirror distortion measuring process). For example, in the case where the wavelength of mirror deformations to be measured is 20 mm and the scan speed over the mirror is 500 mm/s, the relevant time scale for defining "rapid errors" would be 20 mm/500 mm/s=25 ms. Noise occurring on time scales shorter than 25 ms will be filtered out (by averaging) if enough samples are taken during that 25 ms period. For a typical sampling rate of 0.2 ms, 125 samples would be taken during the 25 ms, which would significantly filter out the rapid errors.

If the entire mirror of, say, 400 mm is measured at a scanning speed of 500 mm/s, the total measurement time is 0.8 s. Therefore, (large wavelength) drifts slower than 0.8 seconds are also avoided. After removal of the rapid errors and the slow drifts in this way, all that is left are the changes that occur on intermediate time scales: namely between 25 ms and 0.8 seconds, which are not expected to be too large. For example, it is normal to have thermal substrate table drifts deforming the mirrors on time scales of the order of minutes, and air pressure changes in the interferometer beams creating noise on the ms scale. Both of these sources of noise could be avoided by measuring the mirror at a scanning speed of 500 mm/s for a 400 mm mirror for 20 mm typical wavelength mirror deformations.

More generally, the scanning speed should be chosen so that an entire scan of the mirror can be carried out significantly more quickly than the time required for important mechanisms of slow drift to have a significant effect on the measurement signal. The optimal speed to use in the rapid scan of the present embodiment will depend, therefore, on the particular error mechanisms present.

In summary, the rapid scanning avoids slow drift errors, such as thermal drift of the substrate table WT over minutes, and sampling quickly or carrying out multiple scans allows rapid noise, such as that occurring from pressure variations and other rapid error sources, to be filtered out by averaging. Pressure sensors and thermal sensors may be used to remove the long-term drift of air pressure and air temperature, leaving only the noise.

Where noise in the air pressure/temperature is a factor, the source of the noise will have an effect. For example, in immersion lithography systems where air knives are used to contain an immersion liquid in the region between a final element of the projection system PS and the substrate W, the operational details and quality of the air knife apparatus will be important.

Where dynamical deformation of the substrate table WT and mirrors is expected to be a factor, it may be expected that the acceleration part of the scan may have higher errors than the constant velocity part. In this case, taking readings only during the constant velocity phase of the substrate table WT movement could reduce errors.

As discussed above, the measurement scan speed over the mirror should be chosen to be fast enough to filter out thermal drift and slowly varying errors. However, the scan speed should not be too high otherwise an increased number of rapid errors may start to contribute to the signal unless sampling speeds can be suitably increased. For example, pressure sensors may be provided to measure atmospheric pressure variations, which can be compensated for. However, the pressure sensors may have a limited range so that pressure variations that occur too quickly to be detected and compensated for by the pressure sensor may contribute to errors in the mirror measurement unless the mirror is scanned slowly enough for these errors to be filtered/averaged away. Therefore, a balance can be struck between measurement scanning speeds that are fast enough to filter out thermal drift and other slow drift errors, and scanning speeds that are slow enough that sufficient sampling can be used to filter out rapid noise sources.

It has been found that, in immersion systems, a reproducibility of the interferometric measurements of better than 0.5 nm can be achieved using only the constant velocity part of scans with scan speeds between 0.55 and 1.1 m/s. These scan speeds correspond to scan times of around 0.5 seconds.

As mentioned above, in a dual stage lithographic system, substrate alignment measurements may be carried out with the substrate table WT at a measurement station 46 and means provided to move the substrate table WT from the measurement station 46 to an exposure station 44 when alignment is completed and the substrate W is ready to be exposed. Mirrors are formed in lateral sides of the substrate table WT and are used to measure the position of the substrate table WT while it is being scanned at the measurement station 46 and at the exposure station 44. In certain systems, it is beneficial to use different mirrors for position measurements at the measurement station 46 than at the exposure station 44. This may mean different mirrors for both the X and Y position measurements or, alternatively, different mirrors for just the X or just the Y position measurement. For example, a common mirror may be used for the X measurement, while two mirrors are provided for the Y measurement. Where two mirrors are provided, they may be denoted Y-measure, for the mirror used at the measurement station, and Y-expose, for the mirror used at the exposure station, and may be located on opposite sides of a substrate table WT, for example.

When using different mirrors at the measurement and exposure stations, the relative alignment and/or shape between the mirrors (i.e. the spatial relationship between the mirrors) may change between exposures (due to heating for example), which may lead to overlay errors. Where the same mirrors are used, unexpected mirror deformations would not cause such a problem for overlay as long as the mirrors have the same error during alignment and exposure.

Figure 8:
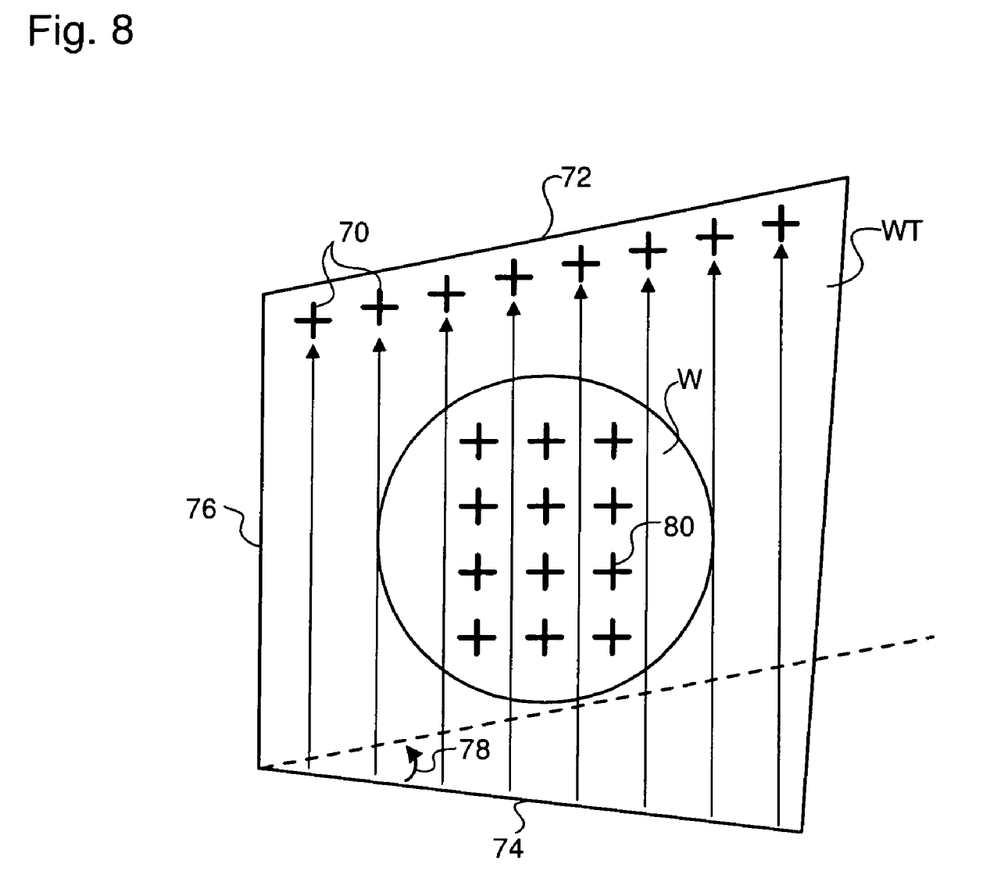
FIG. 8 depicts a substrate table with alignment marks along the Y-expose mirror.

According to an embodiment of the present invention, which is depicted in FIG. 8, this problem is overcome by providing alignment marks 70 on an upper side of the substrate table WT in close proximity to the mirror that is going to be used during alignment at the exposure station 44—the Y-expose mirror 72, which is positioned opposite Y-measure mirror 74. The shape of the substrate table WT has been exaggerated to highlight the deviation from its nominally rectangular form. The so-called "non-ortho" or misalignment between the Y-expose and Y-measure mirrors 72 and 74 is shown by angle 78. The shared X mirror is denoted 76.

The alignment marks 70 should preferably be located within about 10 mm of the Y-expose mirror 72. In a typical system, this separation would cause about 0.05 nm uncertainty in the local shape of the Y-expose mirror 72 as determined from the positions of the alignment marks 70, which is acceptable. This estimate is based on a thermal expansion coefficient of $50 \times 10^{-9}$, and a temperature shift of 0.1 K, the shift in separation of an alignment mark 70 from a corresponding point on the Y-expose mirror being given by $$(50 \times 10^{-9}) \times 0.1 \times (10 \times 10^{-3}) = 0.05 \times 10^{-9} \text{ nm.}$$

During alignment at the measurement station 46, the position of substrate alignment marks 80 are measured relative to the X and Y mirrors operative at the measurement station 46 (the shared X mirror 76 and the Y-measure mirror 74). The positions of the alignment marks 70 are also measured, which, being in close proximity to the surface of the Y-expose mirror 72, correspond closely to the form of the surface of the Y-expose mirror 72. Measurement of the position of the alignment marks 70 relative to the X and Y-measure mirrors 76 and 74 thus yields the spatial relationship between the Y-expose mirror 72 and the Y-measure mirror 74. The precision of the spatial relationship thus obtained will depend on the number of alignment marks 70 that are provided (more closely spaced markers can more precisely define the shape of the mirror surface, picking up small scale deviations for example). As measurement of the alignment marks 70 may take extra time, though, it may be beneficial to measure only a reduced number of alignment marks 70 so as not to compromise throughput too greatly. A change in the relative angle between the Y-expose and Y-measure mirrors 72 and 74 could be obtained by as few as two or three alignment marks 70, for example.

Once the spatial relationship between the Y-expose mirror 72 and the Y-measure mirror 74 has been established, alignment measurements carried out at the measurement station 46 using the Y-measure mirror 74 can be applied when moving the substrate table using the Y-expose mirror 72 at the exposure station 44.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   a projection system configured to project a pattern from a patterning device onto a substrate;
   a substrate table configured to support the substrate and including at least one reflective element formed in a lateral side thereof;
   a substrate table displacement device configured to move the substrate table relative to the projection system;
   a substrate table temperature monitor configured to determine a temperature of at least a portion of the substrate table;
   a disturbance detector configured to estimate a thermally-induced shift in position with respect to a nominal position of the at least one reflective element using the temperature determined by the substrate table temperature monitor;
   a substrate table position detector configured to determine a disturbance compensated position of said substrate table by reflecting radiation from the at least one reflective element to obtain an actual position measurement and adjusting the actual position measurement for the thermally-induced shift in position of the at least one reflective element caused by the temperature and estimated by the disturbance detector; and
   a control system configured to supply a control signal to the substrate table displacement device so as to move said substrate table along a pre-determined path, said control signal being determined based on the disturbance compensated position of the substrate table determined by the substrate table position detector.

2. The lithographic apparatus of claim 1, wherein said substrate table includes two substantially planar reflective elements formed on lateral sides thereof and said disturbance detector is arranged to determine a thermally-induced shift in angle defined between the two reflective elements.

3. The lithographic apparatus of claim 1, further comprising:
a storage device including calibration data providing a mapping between measured temperatures of at least a portion of the substrate table and a corresponding thermally-induced shift in the position of a reflective element formed on a side of the substrate table, and wherein said disturbance detector is configured to estimate said thermally-induced shifts by extracting data from said calibration table.

4. The lithographic apparatus of claim 1, wherein said disturbance detector is configured to estimate said thermally-induced shift in the position using a mathematical model describing how the substrate table is expected to be distorted as a function of the temperature of at least a portion of the substrate table.

5. The lithographic apparatus of claim 1, further comprising:
a liquid supply system configured to at least partly fill a space between a final element of said projection system and said substrate with liquid; and
a seal member configured to substantially contain said liquid within said space between said final element of the projection system and said substrate.

6. A device manufacturing method, comprising:
providing a substrate table to support a substrate and having at least one reflective element formed on a lateral side thereof;
providing a substrate table displacement device to move the substrate table relative to a projection system;
determining a temperature of at least a portion of the substrate table;
estimating a thermally-induced shift in position with respect to a nominal position of the at least one reflective element using said determined temperature;
determining a disturbance compensated position of said substrate table by reflecting radiation from the at least one reflective element and adjusting for the estimated the thermally-induced shift in the position of the at least one reflective element; and
using a control system to move said substrate table along a pre-determined path using said substrate table displacement device, a control signal for said control system being determined based on the determined disturbance compensated position of the substrate table that takes into account the estimated shift of the at least one reflective element.

* * * * *